United States Patent
Pahr

(10) Patent No.: US 8,843,343 B2
(45) Date of Patent: Sep. 23, 2014

(54) FAILSAFE IMAGE SENSOR WITH REAL TIME INTEGRITY CHECKING OF PIXEL ANALOG PATHS AND DIGITAL DATA PATHS

(75) Inventor: Per Olaf Pahr, Lier (NO)

(73) Assignee: Aptina Imaging Corporation, George Town (KY)

( * ) Notice: Subject to any disclaimer, the term of this patent is extended or adjusted under 35 U.S.C. 154(b) by 429 days.

(21) Appl. No.: 13/285,183

(22) Filed: Oct. 31, 2011

(65) Prior Publication Data

US 2013/0110444 A1    May 2, 2013

(51) Int. Cl.
*G01C 25/00* (2006.01)
*G06F 19/00* (2011.01)
*H04N 17/00* (2006.01)
*G01R 31/28* (2006.01)
*H04N 5/374* (2011.01)
*H04N 5/3745* (2011.01)

(52) U.S. Cl.
CPC .............. *G06F 19/00* (2013.01); *H04N 17/002* (2013.01); *G01R 31/2829* (2013.01); *G01R 31/2856* (2013.01); *H04N 5/3742* (2013.01); *H04N 5/3745* (2013.01)
USPC ........ 702/116; 250/214 R; 341/118; 345/207; 348/294; 382/274; 702/182

(58) Field of Classification Search
CPC ... H04N 17/002; H04N 5/335; H04N 5/3658; H04N 5/3742; H04N 5/37455; H04N 5/378; H03M 1/108; H03M 1/123; H03M 1/56; G01R 31/2829; G01R 31/2856; G01R 19/00
USPC ........... 702/64, 104, 117, 118, 121, 123, 182; 250/208.01, 214 R, 370.09; 341/118; 345/207; 348/187, 241, 247, 308; 382/274

See application file for complete search history.

(56) References Cited

U.S. PATENT DOCUMENTS

| | | | |
|---|---|---|---|
| 6,903,670 B1 * | 6/2005 | Lee et al. | 341/118 |
| 7,872,645 B2 * | 1/2011 | Myers | 345/207 |
| 8,040,414 B2 * | 10/2011 | Nakao et al. | 348/294 |
| 8,275,213 B2 * | 9/2012 | Richardson | 382/274 |
| 2007/0138375 A1 * | 6/2007 | Lee et al. | 250/214 R |

* cited by examiner

*Primary Examiner* — John H Le

(57) ABSTRACT

A method of testing analog and digital paths of a pixel in a row of an imager, includes the following steps: (a) injecting first and second charges into the analog path of the pixel, wherein the first charge is in response to a light exposure, and the second charge is in response to a built-in test; (b) sampling the first and second charges to form an image signal level and a test signal level, respectively; and (c) converting, by an analog-to-digital converter (ADC), the image signal level and the test signal level to form image data and test data, respectively. The method then validates the image data based on the test data.

20 Claims, 11 Drawing Sheets

FAILSAFE IMAGE SENSOR WITH REAL TIME INTEGRITY CHECKING OF PIXEL ANALOG PATHS AND DIGITAL DATA PATHS

FIELD OF THE INVENTION

The present invention relates, in general, to image sensors. More specifically, the present invention relates to systems and methods for running online tests of an image sensor's pixel analog paths and digital data paths. This is accomplished without losing data or frame rate, although a short time slot is allocated to performing the tests.

BACKGROUND OF THE INVENTION

Automotive safety critical applications, such as emergency braking to prevent a crash, require that the CMOS imager runs self tests at regular intervals during operation to detect any failure mechanism that may occur due to reliability issues. As other examples, imagers are used as sensors in lane tracking systems, edge-of-road detection systems, near-obstacle-avoidance detection systems, crash alert systems and passenger position sensing systems. Such safety critical applications require imagers with high reliability.

Conventional imagers are tested at the manufacturer using precision equipment to inject a known quantity of light and compare the imager output to the expected output resulting from the known quantity of light. Such test equipment is generally sophisticated and correspondingly expensive. Additionally, operational testing is performed at the manufacturer using precision equipment to inject a known quantity of light and compare the imager output to the expected output resulting from the known quantity of light. Such test equipment is generally sophisticated and correspondingly expensive.

Camera systems for use in safety critical applications can be designed based on a "majority vote" among three cameras viewing approximately the same scene. As an example, one of three cameras detects an object interpreted by its image processing software as the headlights of an approaching car on a collision path. Since no such object is detected in either of the two other cameras, no further action is required and the images for the other two cameras are used for image processing. The failing camera unit results in an error message "camera service required immediately". Such a "majority vote" camera system has a relative large latency, before a pixel error or a pixel cluster error is detected by the software in the camera system. This is so, because pixel cluster defect errors occurring over the product's lifetime must interfere with the detection of relevant objects in the image to trigger an alarm.

In contrast, a less expensive two-camera system for use in safety critical application may be designed based on active real-time validation of pixel output circuits. As will be described, the present invention uses a column-parallel analog-to-digital-converter (ADC) architecture of an image sensor. The present invention provides complete testing of the signal path from each pixel in a row and throughout the column-parallel ADC architecture. In addition, the test is run during real time image processing, without losing real data or frame rate.

BRIEF DESCRIPTION OF THE FIGURES

The present invention may be understood from the following detailed description, when read in connection with the accompanying figures.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "pixel," as used herein, refers to a photo-element unit cell containing a photo sensor and associated transistors for converting photons to an electrical signal. For purposes of illustration, a small number of representative pixels are illustrated in the figures and description herein; however, typically fabrication of a large plurality of like pixels proceeds simultaneously. Accordingly, the following detailed description is not to be taken in a limiting sense; and the scope of the present invention is defined only by the appended claims.

In addition, although the invention is described below with reference to a CMOS imager, the invention has applicability to any solid state imaging device having a storage node which is reset and then has charges transferred to it. The following detailed description is, therefore, not to be taken in a limiting sense, and the scope of the present invention is defined only by the appended claims.

Figure 1:
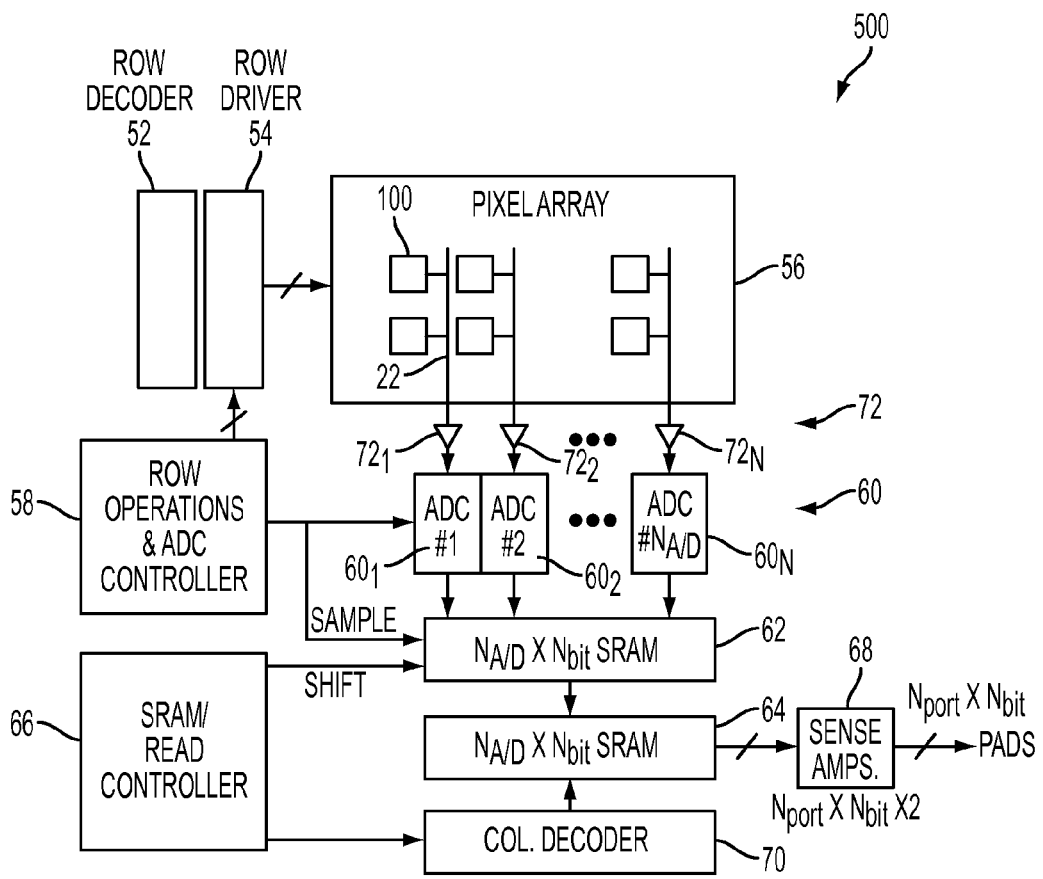
FIG. 1 is a block diagram of a conventional imager.

Now referring to the figures, where like numerals designate like elements, FIG. 1 shows a CMOS imager 500 comprising a pixel array 56 containing multiple pixels 100 organized into a plurality of rows and columns. The device 500 also contains a row decoder 52, row driver 54, row operations and ADC (analog-to-digital converter) controller 58, a plurality of analog-to-digital converters $60_1, 60_2, \ldots, 60_n$ (collectively analog-to-digital converters 60), a static random access memory (SRAM)/read controller 66, a plurality of sample-and-hold (S/H) and amplifier circuits $72_1, 72_2, \ldots, 72_n$ (collectively S/H circuits 72), two memory banks 62, 64, sense amplifier circuitry 68 and a column decoder 70.

The S/H circuits 72 are connected to the column lines 22 of the array 56. The analog-to-digital converters 60 are connected to the S/H circuits 72 by what is commonly known as a column-parallel architecture. That is, in the illustrated imaging device 500, each column or column line 22 of the array 56 is connected to a respective analog-to-digital converter 60, which operate in parallel to convert analog signals from the array 56 (via the S/H circuitry 72) to digital signals.

The imaging device 500 is operated by the row operations and ADC controller 58, which controls the row driver 54 and the analog-to-digital converters 60. The row operations and ADC controller 58 also issues a sample control signal SAMPLE to the first memory bank 62, which is illustratively an SRAM device. The second controller, i.e., the SRAM/read controller 66 also controls the operation of the imaging device 500 by controlling the second memory bank 64 which is a SRAM device via a shift control signal SHIFT, and by controlling the column decoder 70.

In operation, row lines are selectively activated by the row driver 54 in response to the row decoder 52. The S/H circuits 72 input a pixel reset signal VRST and a pixel image signal VSIG for selected pixels. A differential signal is produced, by a differential amplifier within the S/H circuits 72, for each pixel and is digitized by the analog-to-digital converters 60. The digitizing of the data from each column is performed in parallel. The digitized signals are stored in the first memory bank 62 (when the sample control signal SAMPLE is issued) and subsequently shifted into the second memory bank 64. The sense amplifier circuitry 68 senses the stored digital data from the second memory bank 64 and outputs the digital information so that it may be processed by, for example, an image processor (not shown).

Figure 2:
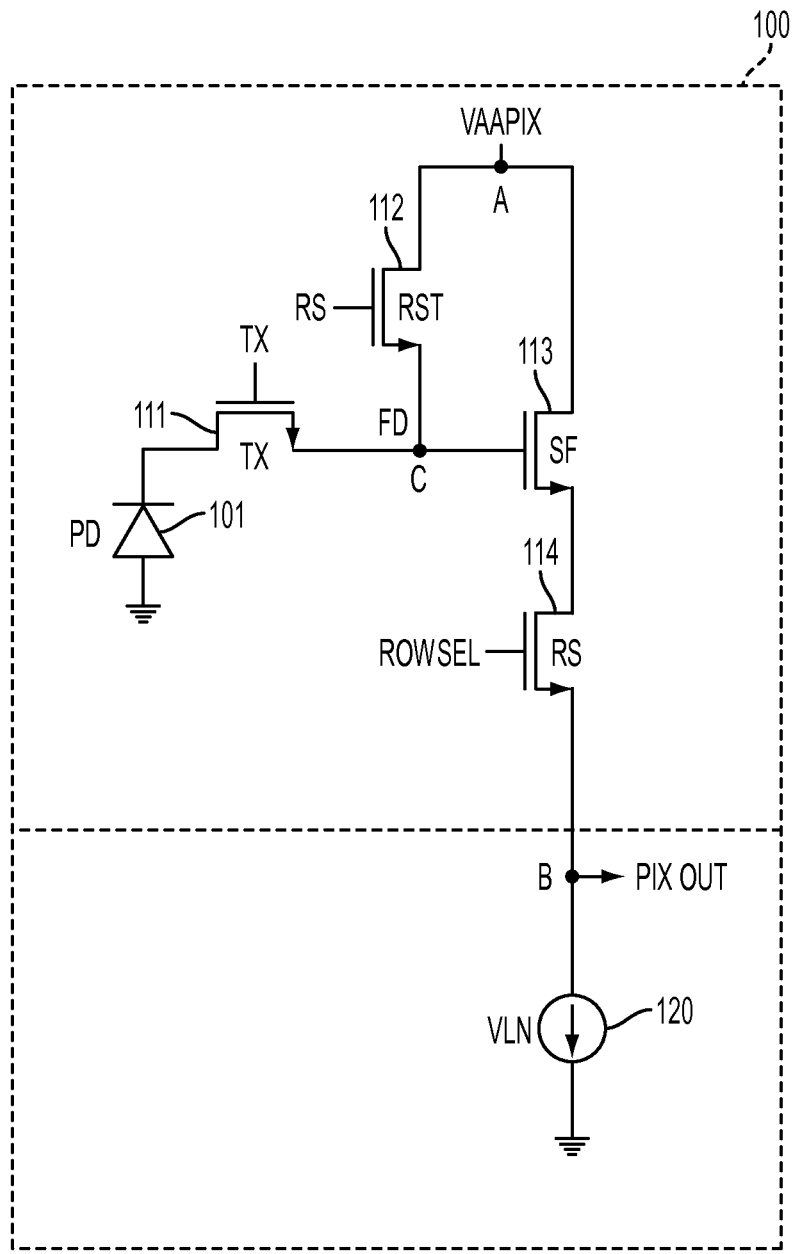
FIG. 2 illustrates a conventional 4-transistor pixel circuit with an associated load.

FIG. 2 is an illustration of a conventional four transistor (4T) pixel 100 and an associated load circuit 120 (shown as a current source). The pixel 100 includes a light sensitive element 101, shown as a photodiode, a floating diffusion (FD) region C, and four transistors, namely, a transfer transistor 111, a reset transistor 112, a source follower transistor 113, and a row select transistor 114. The pixel 100 accepts a TX control signal for controlling the potential barrier of the transfer transistor 111, a RS control signal for controlling the conductivity of the reset transistor 112, and a SEL control signal for controlling the conductivity of the row select transistor 114. The voltage at the floating diffusion region C and the current bias of the source follower transistor 113 controls the conductivity of the same source follower. The output of the source follower transistor 113 is presented to load circuit 120 through the row select transistor 114, in which the latter outputs a pixel signal at node B, when the row select transistor 114 is conducting (i.e., when SEL is asserted).

The states of the transfer and reset transistors 111, 112 determine whether the floating diffusion region C is coupled to the light sensitive element 101 for receiving photo generated charge generated by the light sensitive element 101 during a charge integration period, or a source of pixel power VAA from node A during a reset period.

The pixel 100 is operated as follows: The SEL control signal is asserted to cause the row select transistor 114 to conduct. At the same time, the RS control signal is asserted while the TX control signal is not asserted. This couples the floating diffusion region C to the pixel power VAA at node A, and resets the voltage at node C to an initial voltage. The pixel 100 outputs a reset signal VRST to the load circuit 120. Node B is coupled between the row select transistor 114 and the load circuit 120 and serves as an input to a sample-and-hold circuit (not shown) that samples and holds the pixel reset voltage VRST.

After the reset signal VRST has been output, the RS control signal is de-asserted. The light sensitive element 101 has been exposed to incident light and accumulates charge on the level of the incident light during a charge integration period. After the charge integration period and the output of the signal VRST, the TX control signal is asserted. This couples the floating diffusion region C to the light sensitive element 101. Charge flows through the transfer transistor 111 and diminishes the voltage at the floating diffusion region C. The pixel 100 outputs a photo signal VSIG to the load circuit 120 which appears at node B and is sampled by the sample-and-hold circuit (not shown). The reset and photo signals VRST, VSIG, are different components of the overall pixel output (i.e., Voutput=VRST−VSIG).

Figure 3:
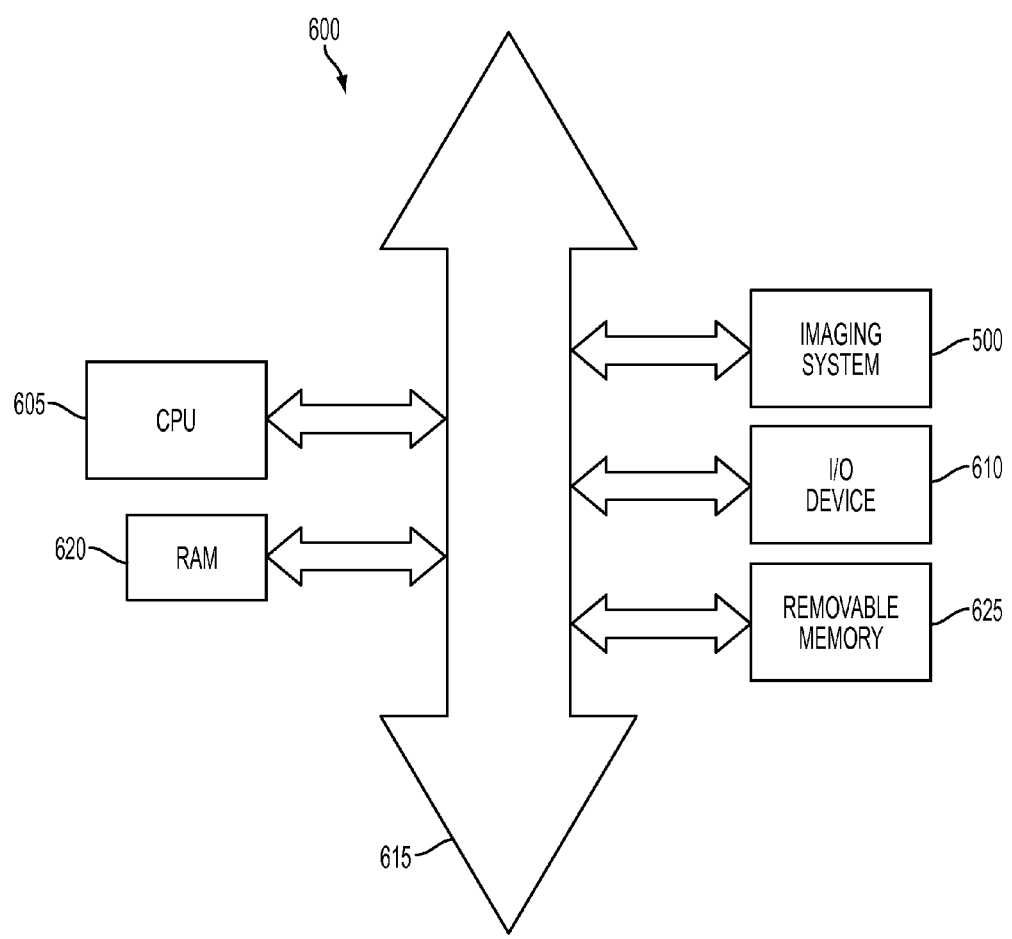
FIG. 3 is a block diagram of the imager of FIG. 1 communicating with other devices by way of a bus.

FIG. 3 illustrates a processor-based system 600, for example a camera system, which generally includes a central processing unit (CPU) 605, such as a microprocessor, that communicates with an input/output (I/O) device 610 over a bus 615. The system 600 also includes an imaging device 500 constructed in accordance with any of the embodiments of the invention. Imager 500 also communicates with the CPU 605 over bus 615. The processor-based system 600 also includes random access memory (RAM) 620, and can include removable memory 625, such as a flash memory, which also communicates with CPU 605 over bus 615. Imager 500 may be combined with a processor, such as a CPU, digital signal processor, or microprocessor, with or without memory storage on a single integrated circuit or on a different chip than the processor.

Figure 4A:
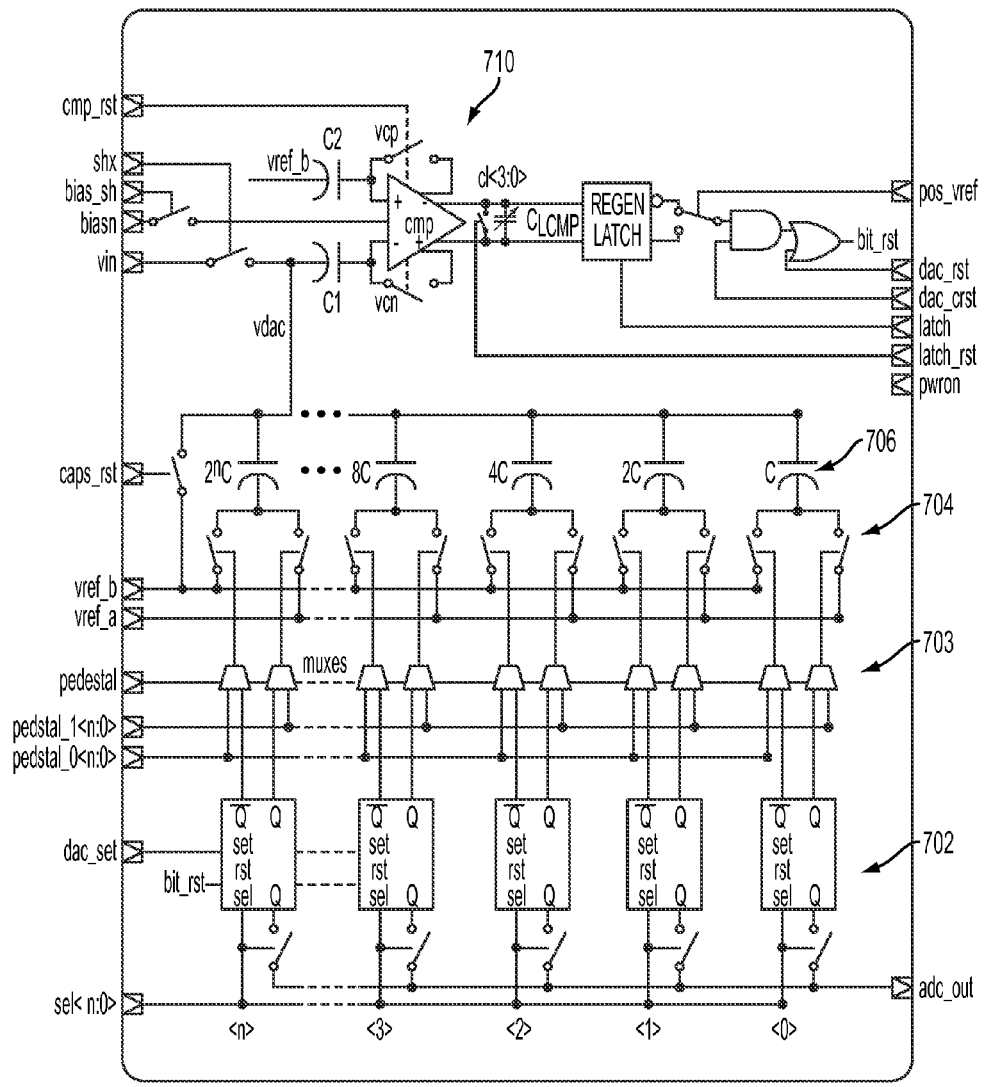
FIGS. 4A and 4B are a circuit diagram and a block diagram, respectively, of a charge redistribution analog-to-digital-converter (ADC) with a successive approximation register (SAR), in which the reference voltages are (Vrefa−Vrefb), in accordance with an embodiment of the present invention.

Referring next to FIG. 4A, there is shown a detailed circuit of the core component of a successive approximation ADC. Specifically, the circuit includes a charge redistribution digital-to-analog (DAC) converter with a successive approximation register (SAR) 702. The circuit shown is mostly a conventional circuit, except that it has a new "positive_Vref" input (right-side of figure), which is described later. A high-level block diagram of a similar circuit is shown in FIG. 4B.

Figure 4B:
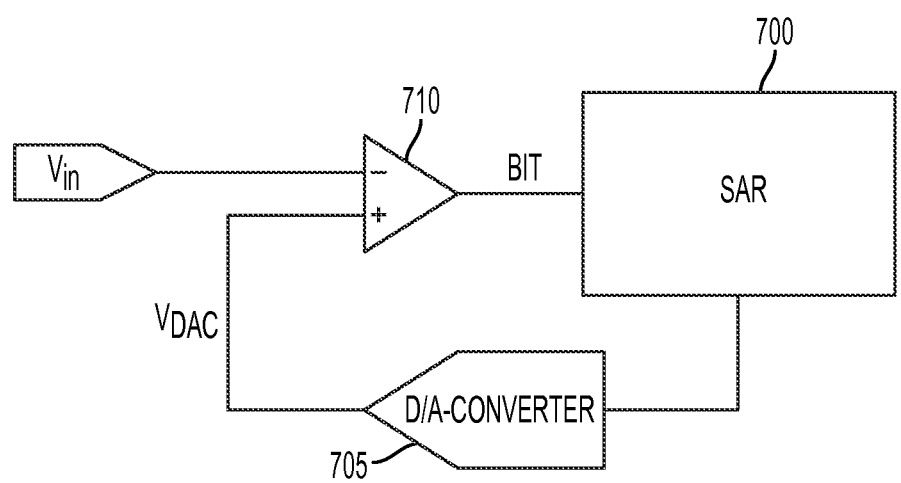

Referring now to FIG. 4B, the block diagram includes comparator 710, SAR 700 and DAC 705. The comparator 710 provides an output "bit" when Vdac is smaller than the input pixel voltage, "Vin". The SAR 700 sequentially closes in on the level of "Vin" by changing the Vdac level provided by DAC 705. The DAC 705 is a parallel DAC.

Referring back to FIG. 4A, the parallel DAC includes "n" Q-flip-flops, designated as 702, whose outputs are controlled by sel<n:0> signals placed by a digital controller (not shown) on "n" lines of a bus (bottom of figure). Depending on the code from the sel<n:0> signals, the appropriate flip-flops 702 control corresponding switches 704, by way of multiplexers (muxes) 703. The selected switches 704 charge a bank of capacitors (C, 2C, 4C, 8C, ... $2^nC$), designated as 706, by way of voltage lines Vrefa and Vrefb. A corresponding analog voltage is provided to the Vdac node of capacitor C1.

It will be appreciated that the circuit shown in FIG. 4A is a typical n-bit analog-to-digital converter (ADC) based on the known charge redistribution principle with additional autozero means to cancel comparator offset and charge injection errors. This type of ADC is used in the present invention without any changes. The n-bit ADC converts the difference between (a) an active pixel reset reference level ("SHR") sampled at time t=t1 at input node "vin" and (b) a second input at the "vin" node of the same reference level minus an image signal level ("SHS") sampled at time t=t2. This is referred to as correlated double sample (CDS), sometimes named "true" CDS, because KT/C noise at the floating diffusion (FD) is cancelled.

The switches controlled by "shx" and "cmp_rst" in FIG. 4A are closed and used for sampling. When the pixel reset level VRST at the DAC node "vdac" has settled, the voltage level across capacitor C1 is $$Vc1=Vcn-VRST.$$

The C1 capacitor carries the pixel reset level information, plus some fixed column-wise and temporal noise components.

The actual sampling is a two-step operation of phase 1 and phase 2, as follows:

In phase 1 of the sampling process, the "cmp_rst" switches open first and inject small charges into C1 and C2. The voltage across C1, thus, equals the pixel reset level with added random temporal noise and fixed pattern noise. The voltage across C2 is $$Vcp=Vcn+Vcomp\_offset+Vcomp\_noise.$$

The random noise component in the offset, including comparator 1/f noise, modulates the threshold level when the comparator is used during the conversion process.

In phase 2 of the sampling process, the shx switch opens at time t=t1. This causes a small random charge injection error in the VRST=Vdac voltage. The average value of the charge injection is negative if an NMOS switch dominates. During Phase 2, the charge on C1 stays constant, because C2 is floating at the minus node of a CMOS comparator.

To remove the average values of the errors caused by charge injections into capacitors C1 and C2 and at the capacitive node "vdac", a double successive approximation process is started in the ADC: One is for the pixel reset level and the other is for the pixel reset level minus the signal level.

Still referring to FIG. 4A, it will be appreciated that clipping is avoided during the conversion process by introducing a "pedestal" in the input-output response curve of the ADC. During sampling, some of the lower bit values are set. Prior to the start of the successive approximation, these bits are reset again, thus, pulling down the voltage at the "vdac" node with the "pedestal value".

The input voltage "Vin" is sampled under three conditions: (1) the Vref_a>Vref_b, (2) a digital pedestal value is set up on the complementary n+1 bit-wide pedestal buses, namely "pedestal_0" and "pedestal_1" and (3) a control signal "pedestal" is enabled.

When the input voltage has settled, the "pedestal" control signal is disabled and an all-bit reset of the SAR pulls down the voltage at the "vdac" node, as much as necessary in order to be well outside the distribution of the peak noise voltages across all columns (considering the noise voltages stored across both the C1 and C2 capacitors and the DAC capacitors). It is important to note that when the second voltage is sampled on the "vdac" node, the charge on C1 and C2 does not change, i.e., the comparator is not reset. The digital pedestal value is identical for both conversions.

As an example, when the pedestal in FIG. 4A is set to decimal value 3 in a 5-bit DAC, the pedestal pull-down voltage is:

$$(3/31)(Vref\_a-Vref\_b).$$

Taking the difference between the two digital values from the SAR with a pedestal, both the average and column-wise random noise stored across C1 and C2 cancels out, greatly improving the accuracy of the ADC. Only temporal random noise, internal to the comparators (due to the preceding circuits in the analog signal path and in the sampling process itself) contribute temporal noise which is not clipped.

It will now be appreciated that the ADC in FIG. 4A has three features useful for digital correlated double sampling (DCDS) of image sensors. First, the ADC gain can be programmed by a full scale voltage, namely:

$$Vfs=Vref\_a-Vref\_b.$$

Secondly, the order of sampling of SHR and SHS can be interchanged, if the polarity of Vfs is changed by swapping Vref_a and Vref_b. Thirdly, regardless of the polarity of Vfs, the pedestal digital value bits are loaded in parallel from the "pedestal_1<n:0>" and "pedestal_0<n:0>" buses by the control signal "pedestal"; the digital pedestal number is the same. This implies that in the fail-safe test method of the present invention, the lowest voltage level and the pedestal with swapped polarity can be converted first; and the highest voltage level corresponding to the actual and final shutter level is the last level sampled with the pedestal and converted. (Note that the comparator has an input polarity switch which is used to accept negative Vfs (full scale reference voltages)).

Figure 5:
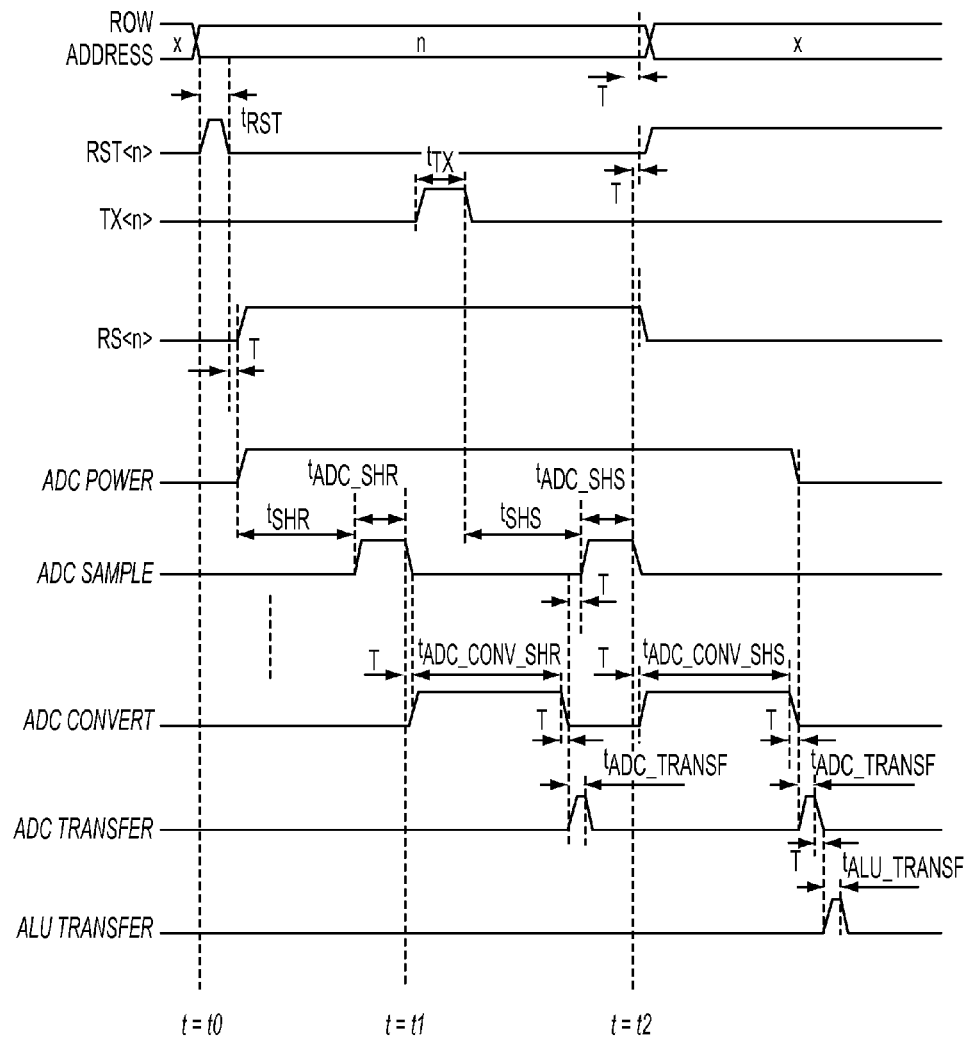
FIG. 5 is a timing diagram illustrating control signals used to read out a row of pixels from an imager in a conventional manner.

Referring next to FIG. 5, there is depicted a timing diagram for the circuit shown in FIG. 4A. The timing diagram is for a DCDS performed in a conventional manner, without the addition of the fail-safe test mode of the present invention. As shown, the DCDS starts with a floating diffusion (FD) reset (RST<n>) at t=to. The sampling instants are at times t1 and t2. With row "n" selected (RS<n>), the ADC is powered ON to sample the pixel's reset reference level (at the vin node) during the SHR sample period. At time t1, the reset reference level is converted and transferred into memory. At time t2, the pixel's signal level (at the vin node) during the SHS sample period is converted and transferred into memory. After subtraction of the two sampled signals in memory, the resulting signal is transferred to the ALU processor (not shown in FIG. 1).

Figure 6:
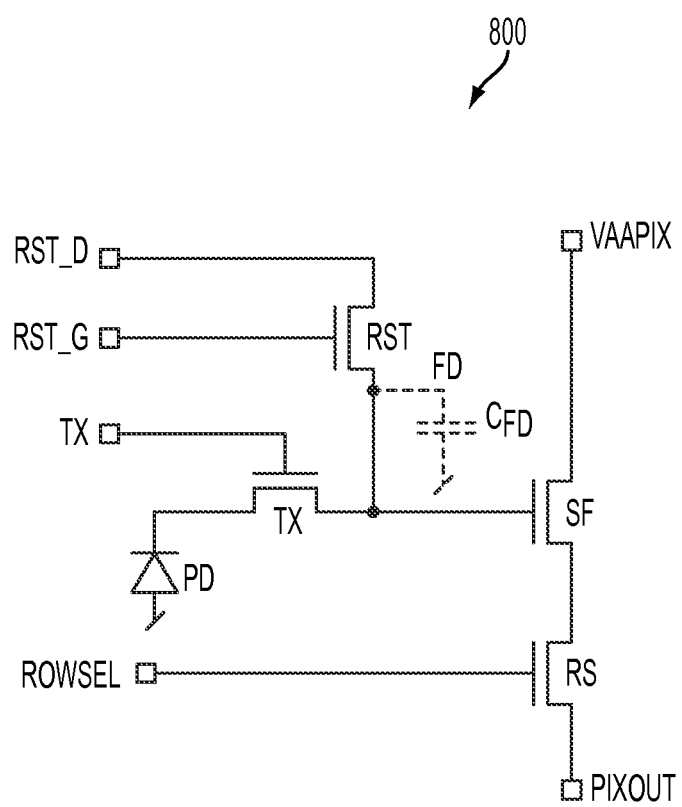
FIG. 6 is a 4-transistor pixel circuit, in accordance with an embodiment of the present invention.

Referring now to FIG. 6, there is shown a 4-transistor pixel circuit, designated as 800. Circuit 800 is similar to the 4-transistor circuit shown in FIG. 2, with some differences. Whereas the drain of the RST transistor is connected to VAAPIX in FIG. 2, the drain of the same RST transistor in FIG. 6 is connected to a separate row access (RST_D) (see also FIG. 7, described later). In one embodiment of the present invention, the test signal is supplied via RST_D and, thereby, set up on the FD node.

Figure 7:
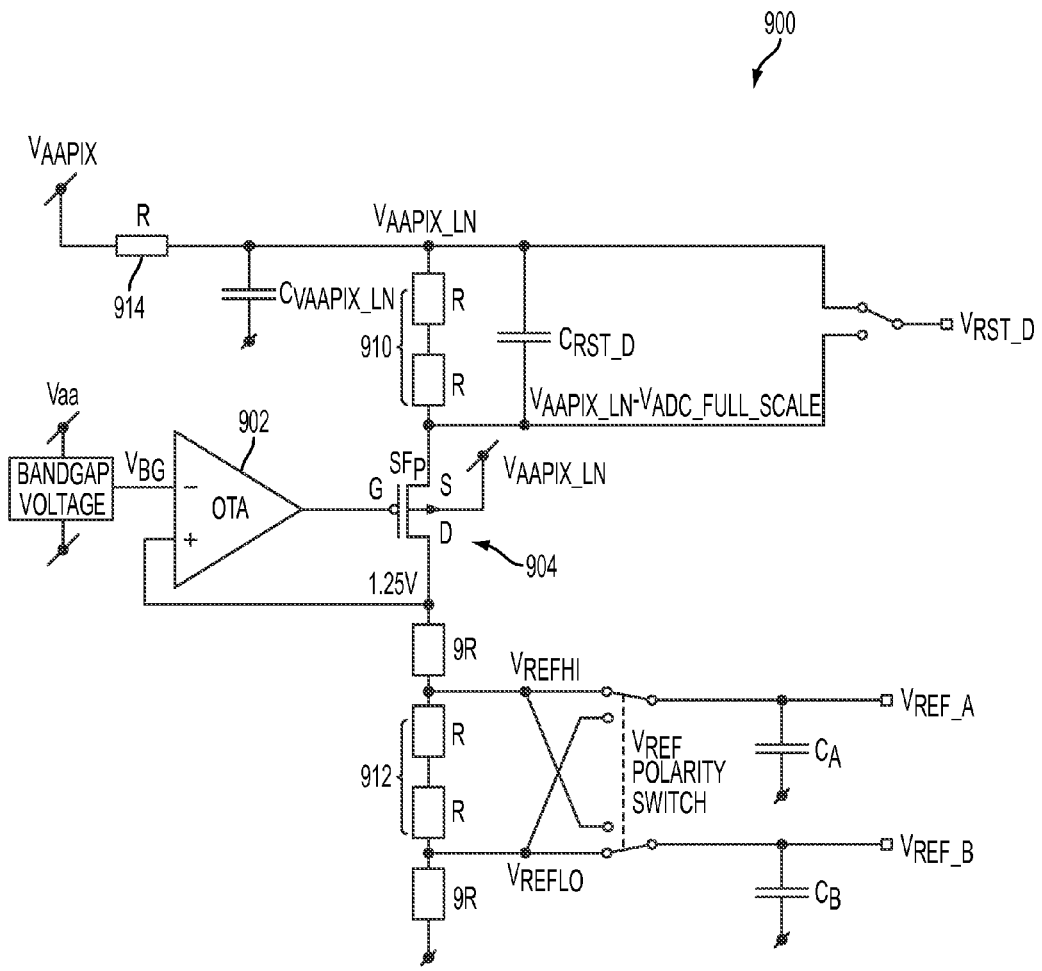
FIG. 7 is a circuit providing either (a) a normal VRST_D output level or (b) a test VRST_D output level, in which (Vrefa−Vrefb) is switched in polarity, in accordance with an embodiment of the present invention.

FIG. 7 depicts a full scale (FS) voltage (represented by Vref_a–Vref_b), which is used for testing by the present invention. The test signal is placed on the VRST_D node of the RST transistor in FIG. 6. The VRST_D node, in FIG. 7, is connected either to (VAAPIX_LN) or (VAAPIX_LN–VADC_FULL_SCALE). When connected to VAAPIX_LN, the VRST_D node behaves conventionally during the SHR and SHS sampling and conversion (during t=t1 and t=t2, as shown in FIG. 5).

On the other hand, when connected to (VAAPIX_LN–VADC_FULL_SCALE), the VRST_D node provides the test mode of the present invention. The test mode includes sampling and conversion of an SHS_TST (signal test) and sampling and conversion of an SHR_TST (reset test) at times t=3 and t=4, respectively (see FIG. 8, which is described below).

Continuing the description of FIG. 7, the operational transconductance amplifier (OTA) 902, which is referenced to an accurate bandgap voltage, Vbg, provides a constant current flow through source follower transistor 904. The constant current flow allows for an accurate voltage drop across each resistor R. Hence, the two serially connected resistors (2R), designated as 910, have the same voltage drop as the two serially connected resistors (2R), designated as 912. Accordingly, the (Vref_a−Vref_b) provided across resistors 912 is also provided across resistors 910. Thus, during the test mode of the present invention, the VRST_D node is pinned to the voltage of (VAAPIX_LN−VADC_FULL_SCALE).

It will be appreciated that resistor 914 and capacitor CVAAPIX_LN provide a low pass filter to the VAAPIX voltage supply. Accordingly, the filtered voltage is referred to herein as VAAPIX_LN. The resistor 914 may be omitted in the circuit shown in FIG. 7.

Finally, the "VREF polarity switch" reverses the polarity of (Vref_a−Vref_b) during the test mode of the present invention. The (Vref_a−Vref_b) is also referred to herein as Vfs, or VADC_FULL_SCALE, as shown in FIG. 7.

Figure 8:
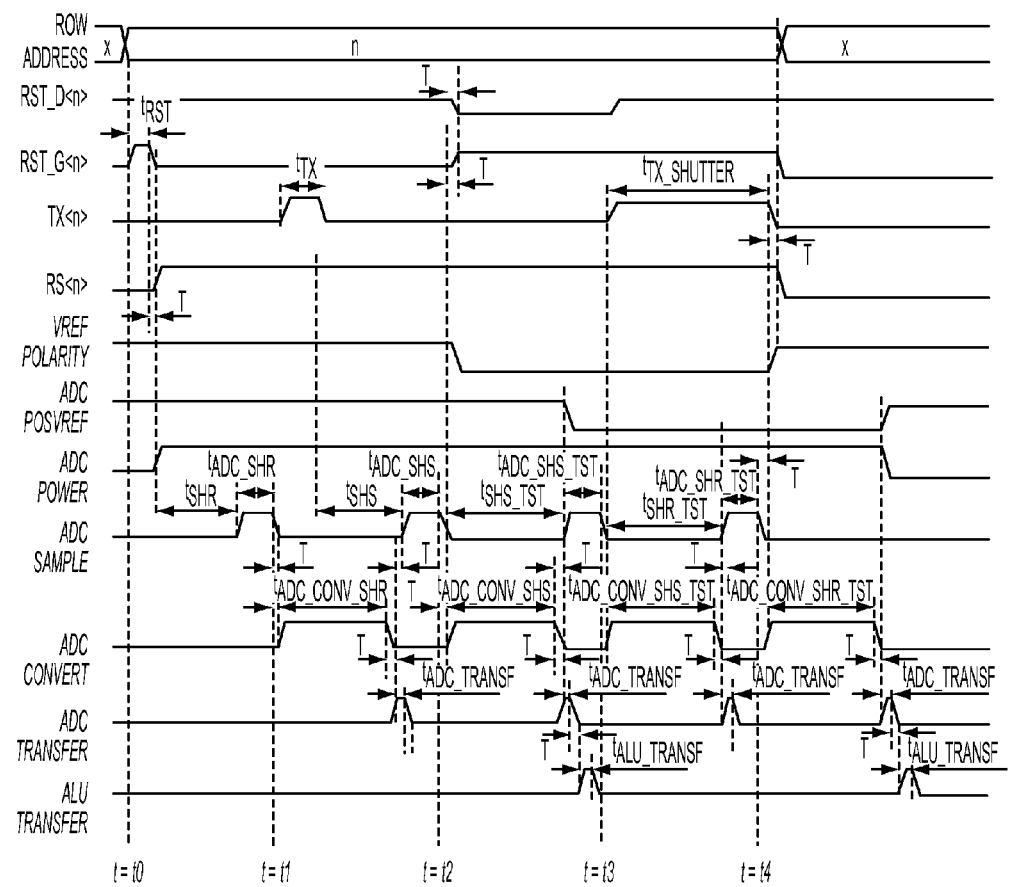
FIG. 8 is a timing diagram illustrating control signals used to read out a row of pixels from an imager during normal operations and during test operations, in accordance with an embodiment of the present invention.
Figure 9:
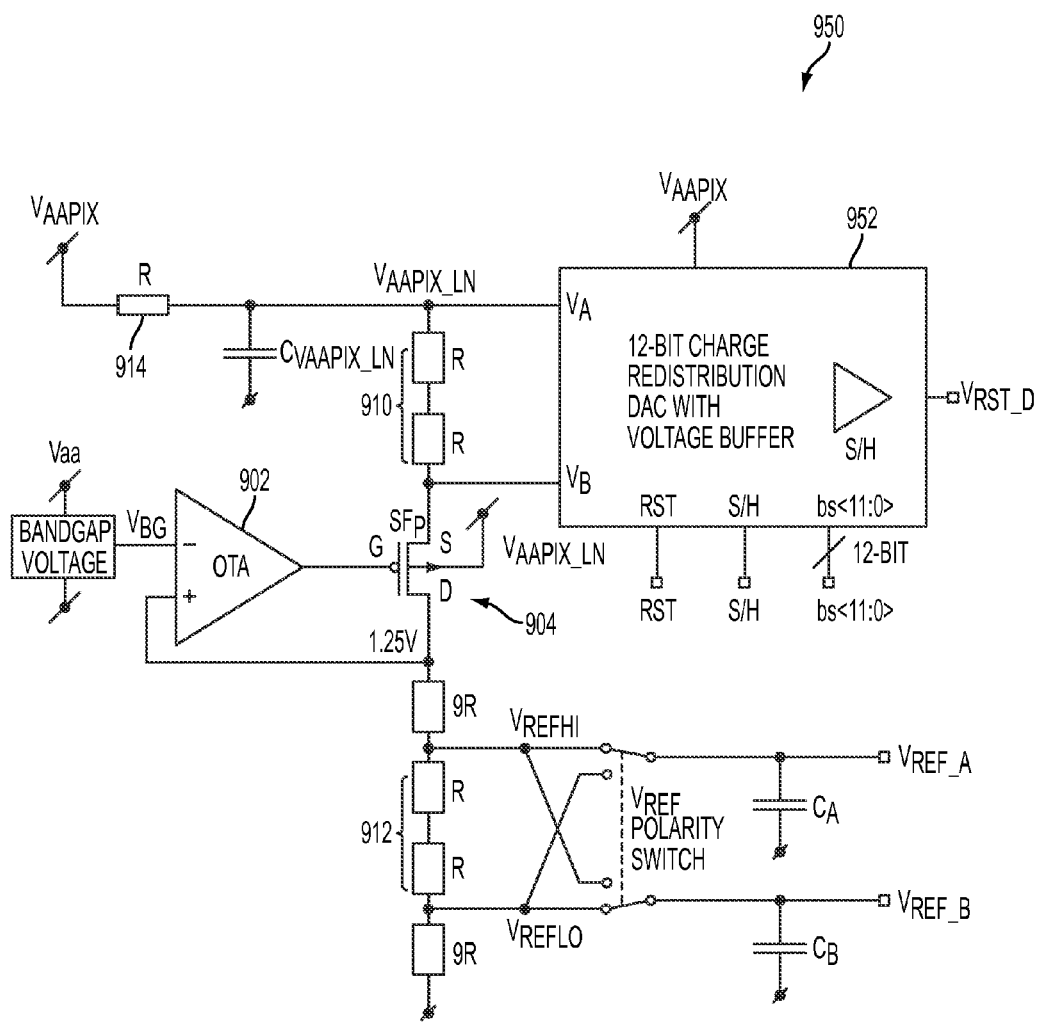
FIG. 9 is a circuit similar to that shown in FIG. 7, except that the VRST_D output test level is provided by a digital-to-analog converter (DAC) with $2^{12}-1$ output test levels, in accordance with an embodiment of the present invention.

Referring next to FIG. 8, there is shown an example of a timing diagram used by the present invention. In comparing the timing diagram of FIG. 8 to the timing diagram of FIG. 5, it will be appreciated that the present invention places the test level, VRST_D, across the RST_D node of the RST transistor and that the RST<n> name is changed to RST_G<n> to distinguish the new drain control node from the old gate control node. In addition, two control signals, namely "VREF polarity" and "ADC_posvref", are new. Furthermore, the new sampling instants t3 and t4 are also new, as described earlier. Note that in the test interval from t2 to t4 (in the specific embodiment shown in FIG. 8) RST_G<n> is turned fully on and kT/C noise at FD is thus replaced by thermal noise (4 kTBR) from the on-resistance "R" of the RST device.

The present invention allows interchanging the order of pixel output sampling in the test mode. Thus, SHS_TST (lowest test level) is done prior to SHR_TST (highest test level), as shown in FIG. 8. The last level sampled during the test mode is actually the real pixel photo diode reset and shutter level performed during normal operation.

The duration of the standard shutter interval is split into two parts. During the first part, or the SHS-test, a first known test voltage of:

$$VAAPIX\_LN - Vdelta = VRST\_D$$

is set up at the drain of the reset transistor (RST) and at the floating diffusion (FD) when RST_G<n> is ON and TX<n> is OFF. In a first embodiment of the invention, the gate voltage at the RST transistor is still ON and the FD tracks VRST_D plus RST device thermal noise. In another embodiment of the invention, the SHS-test is done after turning OFF the RST_G<n>, thereby replacing thermal noise with the equivalent kT/C noise plus charge injection noise. If a failure occurs in the pixel active devices, leakage current errors can be detected.

During the second part of the shutter interval, the SHR-test is set up by placing the TX<n> and RST_G<n> ON and the voltage VAAPIX_LN is set up in the FD in order to reset or shutter the photo diodes of the pixels in that row.

The Vdelta voltage is derived from a voltage bandgap (Vbg) reference, as described earlier with respect to FIG. 7. The Vdelta voltage tracks the ADC full scale voltage at a certain percentage (for example, 100% in FIG. 7) and is known with high accuracy prior to A/D conversion; the level may be reduced with a small number of bits during the SHS-test pedestal conversion. After the polarity switch, as described earlier, fast digital correlated double sampling is done in the opposite order, namely, SHS then SHR, for each pixel row. Thus complete testing of the active part of the pixels is accomplished.

Prior to sending a row of pixel data off-chip, the image processor (not shown) checks if the analog and digital data paths on the sensor are working correctly, including the charge redistribution successive approximation ADC. If no error is found, the row is validated and sent off-chip. If a pixel error, or pixel cluster error is found, an error message may be transmitted off-chip to the application software.

An error message from a 4-way shared pixel may be: "Pixel cluster error in 4 positions (x0, y0) to (x1, y1)". An error message in a two way shared pixel array may be "Pixels fail in positions (x0, y0) and (x1, y1)". The error message may be transmitted prior to transmitting the pending row with the known error. Thus, the built-in test speed is equal to the row-rate. The application program may determine what to do, depending on the severity of the suspected error. The nature of the error(s) determine(s) the actions to be taken.

In summary, the present invention includes a built-in real-time self-test, which allows for complete testing of the signal path from each pixel in a row and throughout the column-parallel ADC architecture. The test is done at the end of each read-out from a row, during an extended row shutter interval.

Performing the SHS-test first followed by the SHR-test has the following speed benefit: The SHS-test follows right after a normal SHS and SHR-test levels are reached and is very fast when the PIXOUT node (FIG. 6) sources current and the ADC FS is 125 mV (gain=8). The SHS-test speed may be improved by increasing the pixel source follower bias current temporarily during the test mode only. Another benefit is that the SHR-test works as the real row shutter. Yet another benefit is that the image signal data from a row is not transmitted off-chip, until real-time validation of both the analog signal path and digital data path for that particular row has been confirmed to work. This validation is done during the shutter interval of each row, in the interval t2 to t4 in FIG. 8, while the image data is waiting in a line memory.

It will be appreciated that all bit switches must work in the charge redistribution DAC, both during sampling and during successive approximation. In one embodiment, the two upper biased resistors "R" set up the full scale voltage to a digital-to-analog voltage converter (DAC), designated as 952, in which the latter may step through all voltage levels, row-by-row. In a 12-bit DAC, there can be a maximum of 4095 levels. These voltage levels may rotate through the rows.

Figure 10A:
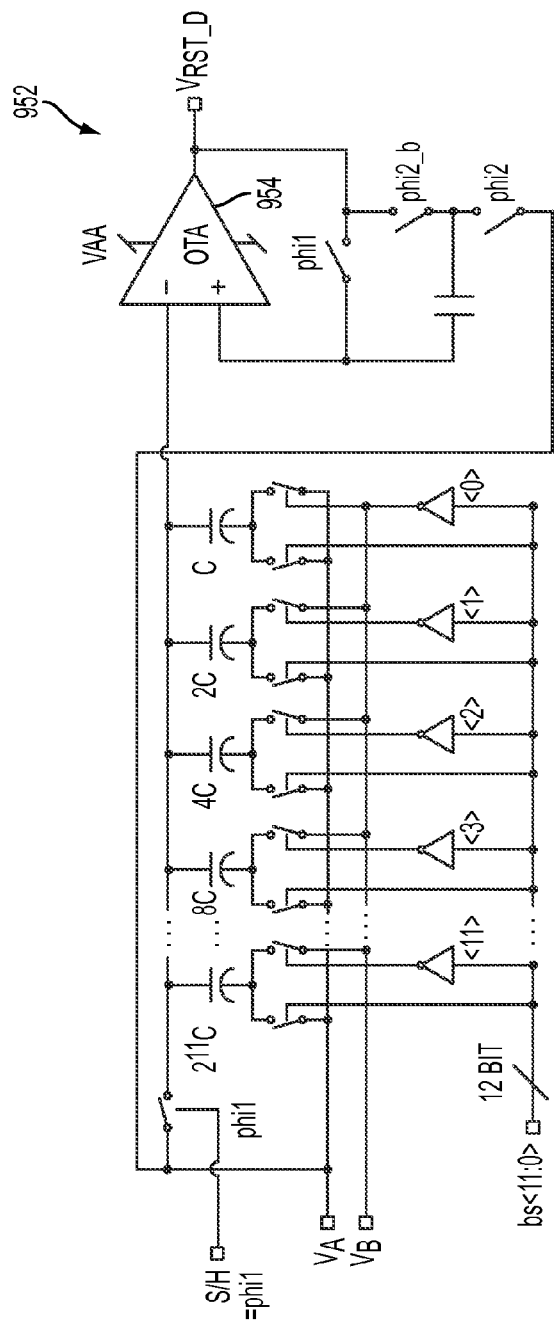
FIG. 10A is a circuit diagram of the DAC shown in FIG. 9, in accordance with an embodiment of the present invention.
Figure 10B:
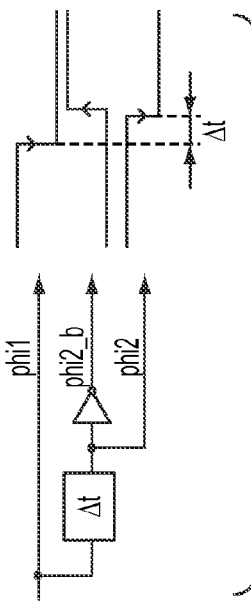
FIG. 10B is a timing diagram showing a delay between the sample-and-hold (S/H) command signal and the offset cancellation for the DAC of FIG. 10A, in accordance with an embodiment of the present invention.

Referring now to FIG. 10A, the 12-bit DAC 952 is depicted in greater detail. As shown, a 12-bit charge redistribution DAC and a unity-gain voltage buffer 954, with offset cancellation on the sample-and-hold (S/H) negative edge of the phi1, are included. Re-sampling is done for each cycle ramp, as shown in FIG. 10B, and errors entering the next tracking phase phi1, starting with a positive edge of phi1, do not matter. It will be appreciated that phi2 and phi2_b are NOT non-overlapping clocks, only phi1 and phi2, which is a delayed version of phi1, are non-overlapping. The reasons why this is effective includes: (1) The capacitor plate connected to the minus input of the OTA floats, when phi2 and phi2_b are switching the capacitor into the feedback loop to subtract the offset voltage stored across the capacitor; thus, no charge is lost. (2) It does not matter if charges are lost when entering the sampling phase. Note that the size of the offset sampling capacitor may be equal to the total capacitance of the DAC. In such a case, the voltage buffer may be designed for an excellent power supply ripple rejection (PSRR).

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method for testing an image sensor comprising the steps of:
   first sampling a first voltage from a pixel in a row, dependent on exposure to light;
   performing a first analog-to-digital (A/D) conversion of the first sampled voltage to provide first digital data;
   injecting a test signal into the pixel in the row;
   second sampling a second voltage from the pixel in the row, after injection of the test signal;
   performing a second A/D conversion of the second sampled voltage to provide second digital data; and
   transferring the first and second digital data to a processor for assessing validity of the first digital data, based on the second digital data.

2. The method of claim 1 wherein
   first sampling the first voltage includes sampling a first reset reference level of the pixel and, subsequently, sampling a first image signal level of the pixel in response to the exposure to the light; and
   second sampling the second voltage includes sampling a second image signal level of the pixel in response to the injecting of the test signal and, subsequently, sampling a second reset reference level of the pixel in the row.

3. The method of claim 2 wherein
   performing the first A/D conversion of the first sampled voltage includes converting the first reset reference level of the pixel and, subsequently, converting the first image signal level of the pixel; and
   performing the second A/D conversion of the second sampled voltage includes converting the second image signal level of the pixel and, subsequently, converting the second reset reference level of the pixel.

4. The method of claim 1 including the step of:
   resetting the pixel in the row during a shutter interval, after performing the first A/D conversion; and
   performing the second A/D conversion includes performing the second A/D conversion during the shutter interval.

5. The method of claim 1 wherein
   injecting the test signal includes injecting a voltage level between VAAPIX and the drain node of a reset transistor disposed in a four-transistor circuit of the pixel.

6. The method of claim 5 wherein
   the voltage level injected is a full-scale voltage level of the image sensor.

7. The method of claim 5 wherein
   the voltage level injected is a selected voltage level per row provided by a digital-to-analog converter (DAC), and
   the selected voltage level varies between zero and a full-scale voltage level of the image sensor, and
   the selected voltage level is referred to VAAPIX.

8. The method of claim 1 including the step of:
   providing a pedestal voltage to the pixel in the row for reducing clipping of an image, wherein the pedestal voltage is based on a full-scale voltage range of the image sensor; and
   injecting the test signal includes injecting a voltage level between VAAPIX and the drain node of a reset transistor disposed in a four-transistor circuit of the pixel, wherein the injected voltage level includes a reversed polarity of the pedestal voltage.

9. The method of claim 1 including the steps of:
   after validating the first digital data, transferring the first digital data to an off-chip processor; and
   after invalidating the first digital data, preventing transfer of the first digital data to the off-chip processor.

10. A method of testing analog and digital paths of a pixel in a row of an imager, comprising the steps of:
    injecting first and second charges into the analog path of the pixel, wherein the first charge is in response to a light exposure and the second charge is in response to a built-in test;
    sampling the first and second charges to form an image signal level and a test signal level, respectively;
    converting, by an analog-to-digital converter (ADC), the image signal level and the test signal level to form image data and test data, respectively; and
    validating the image data based on the test data.

11. The method of claim 10 including the steps of:
    first resetting the pixel, prior to injecting the first charge in response to the light exposure, and
    second resetting the pixel, after injecting the second charge in response to the built-in test.

12. The method of claim 11 wherein
    first resetting the pixel, injecting the first charge, injecting the second charge and second resetting the pixel occur, respectively, at times t0, t1, t2, and t3, and
    each of the times are in numerical time sequence.

13. The method of claim 11 wherein
    the second resetting of the pixel occurs during a shutter period for readying the pixel for the next frame of operation.

14. The method of claim 10 wherein
    injecting the second charge includes providing a voltage between VAAPIX and a drain node of a reset transistor disposed in a four-transistor circuit of the pixel.

15. The method of claim 14 wherein
    the voltage provided between VAAPIX and the drain node of the reset transistor is supplied by a digital-to-analog converter (DAC), and
    the voltage varies between zero and a full-scale voltage level of the image sensor.

16. An image sensor comprising:
    a pixel circuit including a reset transistor having a drain node connected to a switchable voltage reference level,
    a correlated double sampling (CDS) circuit coupled to the pixel circuit for providing a reset reference level (SHR) and an image signal level (SHS), in response to charges in the pixel circuit, and
    a test circuit for providing the switchable voltage reference level,
    wherein when the test circuit provides a VAAPIX voltage level to the reset transistor, the CDS circuit provides a first SHR and a first SHS, in response to charges in the pixel circuit due to light exposure, and
    when the test circuit provides a predetermined voltage level to the reset transistor, the CDS circuit provides a second SHS, in response to charges in the pixel circuit due to the predetermined voltage level.

17. The image sensor of claim 16 wherein
    the CDS circuit is configured to provide a second SHR, in response to charges in the pixel circuit due to the predetermined voltage level, and
    the second SHR is provided during a shutter interval for resetting the pixel circuit for the next frame of operation.

18. The image sensor of claim 16 wherein
the test circuit includes a digital-to-analog converter (DAC), and
the DAC is configured to provide the predetermined voltage level, which varies between zero and a full-scale voltage level of the image sensor, and
the predetermined voltage level is referred to VAAPIX.

19. The image sensor of claim 18 wherein
the full-scale voltage level of the image sensor is provided by a pedestal voltage to the pixel circuit for reducing clipping of an image.

20. The image sensor of claim 16 further including:
an on-chip processor coupled to the CDS circuit for receiving digital data, based on the first SHR, first SHS, and second SHS, and transferring validated digital data to an off-chip processor.

* * * * *